United States Patent
Tamagaki et al.

(10) Patent No.: US 9,828,205 B2
(45) Date of Patent: Nov. 28, 2017

(54) GLASS FILM TRANSFER APPARATUS

(71) Applicant: Kobe Steel, Ltd., Kobe-shi (JP)

(72) Inventors: Hiroshi Tamagaki, Takasago (JP); Yoshimitsu Ikari, Takasago (JP); Naoki Ohba, Takasago (JP); Takeshi Sakurai, Shiga (JP)

(73) Assignee: KOBE STEEL, LTD., Kobe-shi (JP)

( * ) Notice: Subject to any disclaimer, the term of this patent is extended or adjusted under 35 U.S.C. 154(b) by 0 days.

(21) Appl. No.: 14/422,913

(22) PCT Filed: Jul. 19, 2013

(86) PCT No.: PCT/JP2013/004410
§ 371 (c)(1),
(2) Date: Feb. 20, 2015

(87) PCT Pub. No.: WO2014/034013
PCT Pub. Date: Mar. 6, 2014

(65) Prior Publication Data
US 2015/0246787 A1  Sep. 3, 2015

(30) Foreign Application Priority Data

Aug. 27, 2012  (JP) ................................. 2012-186639

(51) Int. Cl.
*B65H 39/16*  (2006.01)
*B32B 37/00*  (2006.01)
(Continued)

(52) U.S. Cl.
CPC ............... *B65H 39/16* (2013.01); *B32B 7/06* (2013.01); *B32B 17/064* (2013.01);
(Continued)

(58) Field of Classification Search
CPC .... B32B 37/0053; B65H 18/08; B65H 20/02; B65H 23/16; B65H 39/16; B65H 41/00;
(Continued)

(56) References Cited

U.S. PATENT DOCUMENTS 1,941,597 A * 1/1934 Cavagnaro ............. B65H 20/24
101/228
3,025,791 A   3/1962 Auerbacher
(Continued)

FOREIGN PATENT DOCUMENTS

CN    101093366 A    12/2007
JP    61 266569      11/1986
(Continued)

OTHER PUBLICATIONS

Machine translation of JP 2005001858.*
(Continued)

*Primary Examiner* — Philip Tucker
*Assistant Examiner* — Jimmy R Smith, Jr.
(74) *Attorney, Agent, or Firm* — Oblon, McClelland, Maier & Neustadt, L.L.P.

(57) ABSTRACT

A glass film transfer apparatus includes a wind-off section that winds off the glass film from a roll around which the glass film is wound, a long interleaf being laminated on the glass film; a glass film transfer section that transfers the glass film which is wound off from the wind-off section and is separated from the interleaf; a take-up section that takes up the glass film transferred by the glass film transfer section in the form of roll, while laminating the long interleaf on the glass film; and an interleaf transfer section that carries out the interleaf separated from the glass film which is wound off from the wind-off section, and carries in the interleaf toward the take-up section. Furthermore, the glass film transfer apparatus includes a take-up adjusting mechanism (Continued)

that adjusts a take-up state of the interleaf and the glass film in the take-up section.

6 Claims, 6 Drawing Sheets

(51) Int. Cl.
*B65H 41/00* (2006.01)
*C23C 14/34* (2006.01)
*C23C 14/56* (2006.01)
*B65H 23/188* (2006.01)
*B32B 7/06* (2006.01)
*B32B 17/06* (2006.01)

(52) U.S. Cl.
CPC ..... *B32B 37/0053* (2013.01); *B65H 23/1888* (2013.01); *B65H 41/00* (2013.01); *C23C 14/34* (2013.01); *C23C 14/562* (2013.01); *B32B 2315/08* (2013.01); *B65H 2511/112* (2013.01); *B65H 2801/61* (2013.01)

(58) Field of Classification Search
CPC .......... B65H 2801/61; B65H 2511/112; B65H 23/048; C03B 35/00; C23C 14/34; C23C 14/562
See application file for complete search history.

(56) References Cited

U.S. PATENT DOCUMENTS

| | | | |
|---|---|---|---|
| 4,069,081 A * | 1/1978 | Drower | ............ B32B 37/00 156/273.3 |
| 4,135,675 A | 1/1979 | Greiner, Jr. et al. | |
| 4,666,550 A | 5/1987 | Spiers et al. | |
| 2008/0029640 A1 | 2/2008 | Chiu et al. | |
| 2011/0010928 A1 | 1/2011 | Tsuchiya et al. | |
| 2011/0204175 A1* | 8/2011 | Sato | ............ B65H 18/103 242/530.2 |
| 2011/0217521 A1 | 9/2011 | Teranishi et al. | |
| 2011/0226405 A1 | 9/2011 | Nishida | |

FOREIGN PATENT DOCUMENTS

| | | | |
|---|---|---|---|
| JP | 61266569 A | * | 11/1986 |
| JP | 1 500990 | | 4/1989 |
| JP | 5 213506 | | 8/1993 |
| JP | H-05213506 | * | 8/1993 |
| JP | 2001-253602 A | | 9/2001 |
| JP | 2005 1858 | | 1/2005 |
| JP | 2005001858 A | * | 1/2005 |
| JP | 2006 264895 | | 10/2006 |
| JP | 2008 189957 | | 8/2008 |
| JP | 2008189957 A | * | 8/2008 |
| JP | 2011 201765 | | 10/2011 |
| JP | 2011 202248 | | 10/2011 |
| JP | 2012 1405 | | 1/2012 |
| JP | 2012-052170 A | | 3/2012 |
| TW | 200817265 A | | 4/2008 |
| TW | 201217258 A | | 5/2012 |
| WO | WO 87/06626 A1 | | 11/1987 |

OTHER PUBLICATIONS

Machine translation of JP 2008189957.*
International Search Report dated Aug. 20, 2013 in PCT/JP2013/004410 Filed Jul. 19, 2013.
Extended European Search Report dated Sep. 18, 2017 in European Patent Application No. 13832163.3, citing documents AA-AD therein (8 pages).

* cited by examiner

GLASS FILM TRANSFER APPARATUS

TECHNICAL FIELD

The present invention relates to a transfer apparatus of a flexible thin glass (glass film) that can be wound in the form of roll.

BACKGROUND ART

In recent years, as a substrate for a display device for displaying an image or the like, a thin glass having excellent gas barrier properties, translucency or the like, that is, a glass film has been used. Currently, the thickness of a typical glass film is about 200 μm, but recently, an extremely thin glass film having a thickness of about 30 μm to 150 μm, which is thinner than 200 μm, has been developed.

Since such an extremely thin glass film has flexibility due to its thinness, it is possible to treat the glass film as a glass roll that is taken up in the form of roll. As the glass roll, for the purpose of preventing the glass film wound in the form of roll from being damaged by coming into contact with the glass film that is adjacent to an inner peripheral side and an outer peripheral side, there is a glass roll in which an interleaf (for example, a protective film) is interposed between the adjacent glass films.

Japanese Unexamined Patent Publication No. 2011-201765 discloses a method for manufacturing a glass roll in which an interleaf is interposed between the adjacent glass films.

The method for manufacturing the glass roll disclosed in Japanese Unexamined Patent Publication No. 2011-201765 is a method of manufacturing a glass roll in which a glass film is formed by a down-draw method and the formed glass film laminated onto an interleaf is taken up in the form of roll. In the manufacturing method, the glass film and the interleaf are taken up, while higher tension in a take-up direction is applied to the interleaf than to the glass film.

As a method of efficiently performing various treatments on such a glass film having flexibility, various techniques of performing various treatments such as coating on its surface, while winding off the glass film from the glass roll in which the long glass film is wound in the form of roll and transferring the glass film in a roll-to-roll manner, have been proposed.

As various treatments on the surface of the glass film, for example, there is a treatment that is performed in a vacuum chamber that is evacuated to the vicinity of the vacuum pressure, such as vacuum deposition or sputtering. Various effects due to the pressure change occur in the vessel that is evacuated to the vicinity of the vacuum pressure. For that reason, various techniques for performing the treatment (surface treatment) such as vacuum deposition or sputtering while transferring the glass film in consideration of the effects to be generated have been proposed.

Japanese Unexamined Patent Publication No. 2012-1405 discloses a transfer apparatus of the thin glass which transfers the thin glass under the vicinity of the vacuum pressure.

The transfer apparatus of the thin glass disclosed in Japanese Unexamined Patent Publication No. 2012-1405 is a transfer apparatus of a thin glass that includes a pressure control means capable of controlling the internal pressure of the vacuum chamber, and transfers the long thin glass in the vacuum chamber evacuated to the vicinity of the vacuum pressure. In the transfer apparatus, the pressure control means evacuates the internal pressure of the vacuum chamber to 10000 Pa over three minutes or longer, in a state in which the roll-shaped thin glass is disposed inside the vacuum chamber, and thereafter, evacuates the pressure to the vicinity of the vacuum pressure.

In the transfer apparatus of the thin glass, after evacuation under the conditions, the interleaf interposed between the thin glasses of the glass roll is detached from the thin glass during winding-off, and the thin glass is taken up in the form of roll, while interposing another interleaf between the thin glasses, when taking up the thin glass subjected to the surface treatment.

In addition, Japanese Unexamined Patent Publication No. 2008-189957 discloses a continuous deposition apparatus that winds off a substrate wound in the form of roll by having the interleaf laminated thereon while separating the substrate from the interleaf, and takes up the wound-off interleaf and the substrate subjected to the deposition process in the form of roll again.

The continuous deposition apparatus disclosed in Japanese Unexamined Patent Publication No. 2008-189957 has a wind-off roll that holds the substrate having the interleaf laminated thereon and taken up in the form of roll, and winds off the substrate and the interleaf; a wind-off section having a wind-off side support roller that rotatably supports the substrate, which is wound off from the wind-off roll, together with an interleaf so that the substrate comes into contact with the interleaf, and transfers it to the downstream side; a take-up side support roller that rotatably supports the substrate passed over the take-up side support roller and transfers it to the downstream side; a take-up section having a take-up roll that takes up the substrate via the take-up side support roller; and a deposition source that forms a film on the surface of the substrate that is continuously transferred in a state in which tension is applied to the take-up side support roller from the wind-off side support roller. In addition, the continuous deposition apparatus has an interleaf separating supply section. The interleaf separating supply section includes an interleaf separating and transferring means for separating the interleaf from the substrate and transferring it to the take-up side, when the substrate passes through the wind-off side support roller together with the interleaf; and an interleaf transferring and supplying means that supplies the interleaf separately transferred by the interleaf separating and transferring means when the substrate after the deposition is supported on the take-up side support roller while being transferred to the substrate so as to be brought into contact with the take-up side support roller and to be laminated on the substrate.

According to the continuous deposition apparatus, it is possible to form a film without causing defects in the substrate.

The continuous deposition apparatus of Japanese Unexamined Patent Publication No. 2008-189957 is not intended to mean the treatment, particularly, aimed at the glass film. However, a configuration of the apparatus, that is, a configuration which separately transfers the interleaf from the deposition target, and takes up the deposition target while laminating the interleaf onto the deposition target is considered to be a preferred configuration as a deposition apparatus of the glass roll described in Japanese Unexamined Patent Publication No. 2011-201765 in which the glass film and the interleaf are laminated.

In order to perform the surface treatment or the like on the thin glass (glass film) manufactured by the manufacturing method of Japanese Unexamined Patent Publication No. 2011-201765, the case of adopting a continuous deposition apparatus of Japanese Unexamined Patent Publication No. 2008-189957 is considered.

The continuous deposition apparatus of Japanese Unexamined Patent Publication No. 2008-189957 is designed based on the assumption that each of the substrate and the interleaf is a resin-based material. For that reason, when the thin glass as an inorganic material is adopted as the substrate in the continuous deposition apparatus of Japanese Unexamined Patent Publication No. 2008-189957 as in Japanese Unexamined Patent Publication No. 2012-1405, the following problem arises.

That is, the interleaf (protective film) as a resin-based material is transferred in a vacuum, moisture and organic substances contained therein are evaporated, and the interleaf shrinks. On the other hand, the glass film as the inorganic substance does not shrink. Therefore, as in the continuous deposition apparatus of Japanese Unexamined Patent Publication No. 2008-189957, when the wound-off interleaf is taken up in the form of roll again together with the glass film, the interleaf becomes shorter than the glass film by the shrinkage to apply excessive force to the glass film, or strong wrinkles are generated by excessive tension, which may lead to damage to the glass film.

Conversely, the interleaf as a resin-based material may also be sometimes stretched by the applied tension, depending on the material and thickness. In this case, the interleaf loosens when taking up the interleaf, the interleaf becomes wavy, and the glass film may be damaged by the unevenness of the wavy interleaf.

That is, in the case of the glass film as a treating target, when the interleaf made of resin laminated onto the glass film that are laminated are taken up, if these films are simply laminated and taken up, slight waviness or the like occurring when taking up the interleaf may cause damage to the glass film.

SUMMARY OF INVENTION

An object of the present invention is to provide a glass film transfer apparatus capable of taking up a glass film and an interleaf that are laminated together, while suppressing the breakage of the glass film.

A glass film transfer apparatus of the present invention is a glass film transfer apparatus configured to continuously transfer a long glass film, which includes a wind-off section that winds off the glass film from a roll around which the glass film having a long interleaf laminated on the glass film is wound; a glass film transfer section that transfers the glass film which is wound off from the wind-off section and is separated from the interleaf; a take-up section that takes up the glass film transferred by the glass film transfer section in the form of roll, while laminating the interleaf on the glass film; an interleaf transfer section that carries out the interleaf separated from the glass film which is wound off from the wind-off section, and carries in the interleaf toward the take-up section; and a take-up adjusting mechanism that adjusts a take-up state of the interleaf and the glass film in the take-up section.

BRIEF DESCRIPTION OF DRAWINGS

FIGS. 2A to 2C-3 illustrate modified examples, respectively.

FIG. 3 is a schematic diagram illustrating a configuration of a glass film transfer apparatus according to a second embodiment of the present invention.

FIG. 5B illustrates a modified example.

DESCRIPTION OF EMBODIMENTS

Figure 1:
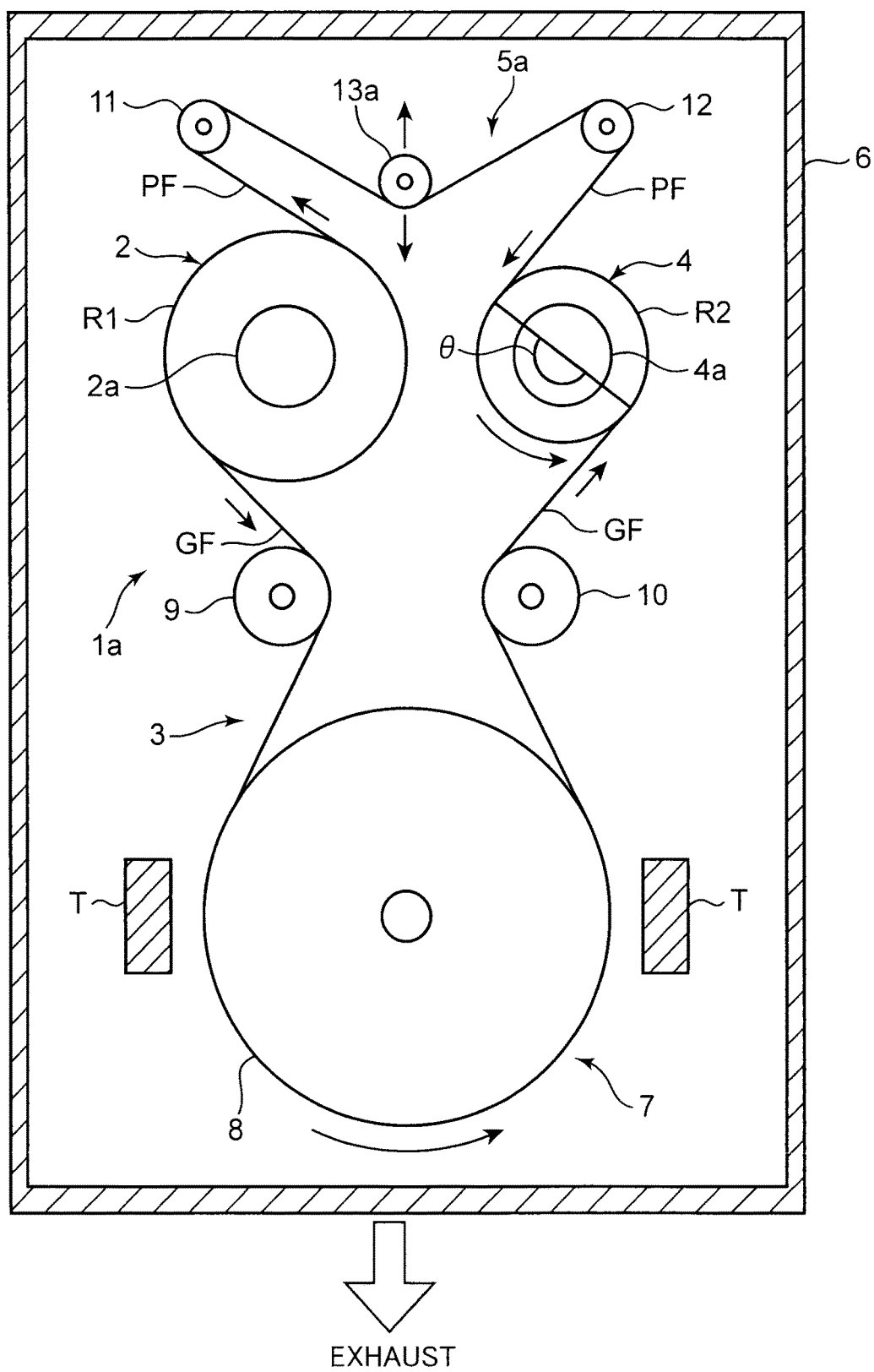
FIG. 1 is a schematic diagram illustrating a configuration of a glass film transfer apparatus according to a first embodiment of the present invention.

A glass film transfer apparatus according to an embodiment of the present invention will be described below with reference to the drawings. In addition, in each of the embodiments and drawings described below, the same components in the glass film transfer apparatus are denoted by the same reference numerals and the same names. Therefore, the same descriptions of the components denoted by the same reference numerals and the same names are not repeated.

First Embodiment

A glass film transfer apparatus 1a according to the first embodiment of the present invention will be described with reference to FIGS. 1 to 2C-3. FIG. 1 is a schematic diagram illustrating a configuration of the glass film transfer apparatus 1a according to the present embodiment. FIGS. 2A to 2C-3 are schematic diagrams illustrating a configuration of a dancer roller mechanism which is used for the glass film transfer apparatus 1a.

The glass film transfer apparatus 1a has a wind-off section 2 that winds off a glass film GF from a glass roll R1 around which the extremely thin glass film GF having, for example, a width of approximately 1 meter and a thickness of approximately 30 μm to 150 μm is wound in the form of roll; a glass film transfer section 3 that transfers the wound-off glass film GF to a surface treatment process of performing the surface treatment such as sputtering or vapor deposition; and a take-up section 4 that takes up the glass film GF subjected to the surface treatment as a roll-shaped glass roll R2 again. The glass film transfer apparatus 1a is, for example, an apparatus that winds off the glass film GF from the glass roll R1 around which the long glass film GF ranging over 100 m or longer is wound in the form of roll, and transfers the glass film in a so-called roll-to-roll manner.

In the glass roll R1, the glass film GF is laminated alternately with resin interleaf PF formed to have substantially the same width as that of the glass film GF. The thickness of the interleaf PF is at the same level as the glass film GF, but as long as it is possible to protect the glass film GF from breakage and damage, the thickness may not be at the same level as the glass film GF. In addition, the expression "the glass film GF and the interleaf PF have substantially the same width" means that a difference between the glass film width and the interleaf width is less than about 100 mm, and less than about 50 mm in a more typical example. Most typically, by setting the interleaf width to be wider than the glass film width by about 50 mm, the breakage of the glass film GF may be prevented even in a case where the glass roll is subjected to accidental force from the end portion. Also, in another example, in some cases, an interleaf called an edge tab may be attached to both ends of the glass film GF. In this case, the interleaf PF is set to have the width that is narrower than that of the glass film GF by 10 to 50 mm, thereby avoiding interference between the interleaf PF and the interleaf. Alternatively, in some cases, the glass film GF and interleaf PF may be set to have exactly the same width.

In this way, the interleaf PF and the glass film GF are wound around an wind-off core 2a, which forms a part of a wind-off section 2 to be described later, and becomes a glass roll R1. The wind-off core 2a is formed by, for example, stainless steel or plastic material.

When the glass film GF is wound off from the wind-off section 2, there are a method of first simultaneously winding off the glass film GF and the interleaf PF, and then separating the glass film GF and the interleaf PF, and a method of alternately winding off the glass film GF and the interleaf PF, the interleaf PF being wound-off after the glass film GF being wound-off.

The configuration of the glass film transfer apparatus 1a according to the present embodiment will be described with reference to FIG. 1. In the following description, a vertical direction toward a plane of FIG. 1 is assumed to be a vertical direction of the glass film transfer apparatus 1a, and similarly, a horizontal direction toward the plane is assumed to be a horizontal direction of the glass film transfer apparatus 1a.

As described above, the glass film transfer apparatus 1a has the wind-off section 2 that winds off the glass film GF from the glass roll R1, the glass film transfer section 3 that transfers the wound-off glass film GF to a surface treatment process, and the take-up section 4 that takes up the glass film GF subjected to the surface treatment in the form of roll again. Furthermore, the glass film transfer apparatus 1a has an interleaf transfer section 5a that transfers the interleaf PF which is wound off from the glass roll R1 at the wind-off section 2 and carries in the interleaf PF toward the take-up section 4. The glass film transfer apparatus 1a having such a configuration is provided, for example, in a box-shaped vacuum chamber 6.

The interior of the vacuum chamber 6 is formed in a hollow case shape, and the interior is hermetically held with respect to the exterior of the vacuum chamber 6. Although it is not illustrated, the vacuum pump is provided below the vacuum chamber 6, and the interior of the vacuum chamber 6 is evacuated to a vacuum state or a low-pressure state by the vacuum pump.

On the left upper side of the central portion in the vertical direction in the vacuum chamber 6 illustrated in FIG. 1, the wind-off section 2 having the glass roll mounted thereon is disposed. The wind-off core 2a is a cylindrical or columnar take-up core having an overall length that is slightly longer than the widths of the glass film GF and the interleaf PF. The wind-off core 2a is formed with the glass roll R1, by alternately winding the glass film GF and the interleaf PF. The glass roll R1 is attached to the interior of the vacuum chamber 6 to form the wind-off section 2.

In the wind-off section 2 having the glass roll R1 mounted thereon in such a way, a rotational axis of the wind-off section 2 having the wind-off core 2a attached thereto is disposed inside the vacuum chamber 6 so as to be a perpendicular direction towards the plane of FIG. 1. Therefore, the wind-off section 2 is a member that rotationally moves about a rotational axis by winding off the glass film GF and the interleaf PF from the glass roll R1.

On the lower side of the center in the vertical direction in the vacuum chamber 6 illustrated in FIG. 1, and below the wind-off section 2, a deposition mechanism section is provided to perform the surface treatment process, such as sputtering and plasma CVD, on the surface of the glass film GF that is wound off from the wind-off section 2 and separated from the interleaf PF. In this embodiment, a sputter deposition section 7 is provided as an example of the deposition mechanism section.

The glass film transfer section 3 includes a transferring member of the glass film GF in the sputter deposition section 7 that performs the surface treatment process. FIG. 1 illustrates a deposition roller 8 and a sputter evaporation source T as a part of the general configuration of the sputter deposition section 7.

The deposition roller 8 of the sputter deposition section 7 illustrated in FIG. 1 is a transferring member that is formed in a cylindrical or columnar shape by stainless steel materials, and transfers the glass film GF while winding the glass film GF on the outer peripheral surface forming a curved surface. The deposition roller 8 is disposed so that an axial center (rotational axis) of the deposition roller 8 as the rotational center is substantially parallel to the axial center as the rotational center of the wind-off section 2.

The sputter evaporation sources T are disposed on the left and right sides of the deposition roller 8 so as to be opposed to the glass film GF transferred by the deposition roller 8. The sputter evaporation source T is an evaporation source that consists of components deposited on the surface of the glass film GF. As is well known, in the sputter evaporation source T, the components sputtered (evaporated) by a glow discharge are guided and deposited to the surface of the glass film GF.

As described above, the deposition roller 8 is a member that transfers the glass film GF which is wound off from the wind-off section 2 to perform the surface treatment process, and constitutes the glass film transfer section 3.

Also, referring to FIG. 1, the glass film transfer apparatus 1a is provided with a first guide roller 9 between the wind-off section 2 and the deposition roller 8. The first guide roller 9 is a member that is formed in a cylindrical or columnar shape by the stainless material similar to the deposition roller 8. The first guide roller 9 has a cylindrical or columnar shape having an outer diameter that is smaller than an outer diameter of the deposition roller 8.

The rotational axis of the first guide roller 9 is parallel to the rotational axes of the wind-off section 2 and the deposition roller 8, and is disposed closer to the center of the vacuum chamber 6 than the left end of the deposition roller 8, that is, closer to the rotational axes of the deposition roller 8 in the horizontal direction of the vacuum chamber 6. This arrangement of the first guide rollers 9 enables the glass film GF always to be transferred to the deposition roller 8 from a fixed angle and direction.

The glass film transfer section 3 can be configured by only the deposition roller 8, but in this embodiment, the glass film transfer path is formed by the glass film transfer section 3 being constituted by the deposition roller 8 and the first guide roller 9.

In the vacuum chamber 6 illustrated in FIG. 1, the take-up section 4 is disposed on the right side of the wind-off section 2 toward the plane in FIG. 1. The take-up section 4 takes up the glass film GF subjected to the surface treatment through the glass film transfer section 3 as the roll-shaped glass roll R2 again.

The take-up section 4 has a configuration similar to that of the wind-off section 2, and has a take-up core 4a as a long cylindrical or columnar take-up core having an overall length that is slightly longer than the widths of the glass film GF and the interleaf PF. The take-up section 4 is disposed within the vacuum chamber 6 so that the rotational axis of the take-up section 4 as an axial center of the take-up core becomes the vertical direction toward the plane of FIG. 1, that is, is parallel to the rotational axes of the wind-off section 2 and the deposition roller 8.

Such a take-up section 4 takes up the interleaf PF from an interleaf transfer section 5a which will be described below, and takes up the glass film GF from the glass film transfer section 3, by rotationally moving about the rotational axis by an actuator or the like.

Here, as illustrated in FIG. 1, the glass film transfer apparatus 1a has a second guide roller 10 between the take-up section 4 and the deposition roller 8 and on the right side of the first guide roller 9. The second guide roller 10 is a member that has the same configuration as that of the first guide roller 9 and is formed in a cylindrical shape or a columnar shape by the stainless material similar to the deposition roller 8. The second guide roller 10 has the same outer diameter as the outer diameter of the first guide roller 9.

The rotational axis of the second guide roller 10 is a parallel to the rotational axes of the take-up section 4 and the deposition roller 8, and is disposed closer to the center of the vacuum chamber 6 than the right end of the deposition roller 8 in the horizontal direction of the vacuum chamber 6, that is, closer to the rotational axis of the deposition roller 8. This arrangement of the second guide roller 10 enables the glass film GF always to be carried out to the deposition roller 8 along the fixed angle and direction.

In the above description, in the glass film transfer apparatus 1a, the configuration until the glass film GF which is wound off from the wind-off section 2 is taken up around the take-up section 4 again is described. A configuration until the interleaf PF which is wound off from the wind-off section 2 is taken up around the take-up section 4 as a roll again will be described below.

The glass film transfer apparatus 1a is provided with an interleaf transfer section 5a that carries out the interleaf PF separated from the glass film GF which is wound off from the wind-off section 2, and carries in the interleaf PF toward the take-up section 4.

As illustrated in FIG. 1, the interleaf transfer section 5a has a first interleaf roller 11 disposed above the wind-off section 2, a second interleaf roller 12 disposed above the take-up section 4, and a dancer roller 13a disposed almost in the intermediate between the first interleaf roller 11 and the second interleaf roller 12.

The first interleaf roller 11 and the second interleaf roller 12 are cylindrical or columnar rollers that have substantially the same configurations as those of the first guide roller 9 and the second guide roller 10. In this embodiment, the outer diameters of the first interleaf roller 11 and the second interleaf roller 12 are smaller than the outer diameter of the first guide roller 9 and the second guide roller 10. Each of the first interleaf roller 11 and the second interleaf roller 12 is disposed so that the rotational axes in the vicinity right above the wind-off section 2 and the take-up section 4 are substantially parallel to the rotational axes of the wind-off section 2 and the take-up section 4.

The dancer roller 13a is a roller that has substantially the same configuration as those of the first interleaf roller 11 and the second interleaf roller 12. The dancer roller 13a is disposed so that its rotational axis is substantially parallel to the rotational axes of the first interleaf roller 11 and the second interleaf roller 12 at a substantially intermediate position between the first interleaf roller 11 and the second interleaf roller 12. The dancer roller 13a is mounted inside the vacuum chamber 6 so as to be linearly movable in the vertical direction, while keeping the parallel state of the rotational axes.

Figure 2A:
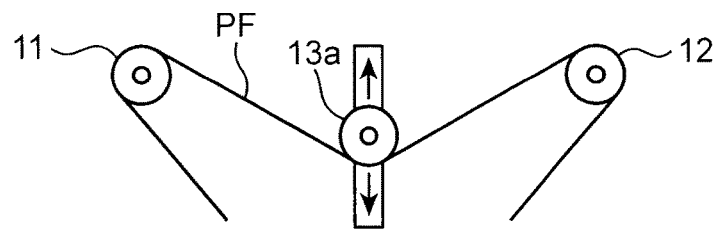
FIGS. 2A to 2C-3 are schematic diagrams illustrating a dancer roller mechanism of the glass film transfer apparatus according to the first embodiment.

As illustrated in FIG. 2A, an intermediate position in the movement range in the vertical direction of the dancer roller 13a is slightly lower than the rotational axes of the first interleaf roller 11 and the second interleaf roller 12. The dancer roller 13a achieves a dancer roller mechanism in which load is applied to the interleaf PF stretched from the first interleaf roller 11 to the second interleaf roller 12, by coming into contact with the interleaf along the width direction of the interleaf PF from the above, while moving up and down by its own weight or a linear slider in the movement range of the vertical direction, thereby applying tension along the transferring direction of the interleaf PF.

When the transfer path length of the interleaf PF is lengthened by extension, the dancer roller 13a moves downward as much as the transfer path length is lengthened, and the transfer path length of the interleaf PF is adjusted to be lengthened between the first interleaf roller 11 and the second interleaf roller 12. Conversely, when the transfer path length of the interleaf PF is shortened by shrinkage, the dancer roller 13a moves upward as much as shortening of the transfer path length, and the transfer path length of the interleaf PF between the first interleaf roller 11 and the second interleaf roller 12 is adjusted to be shortened.

That is, since the dancer roller 13a appropriately adjusts the transfer path length of the interleaf PF, and always applies tension to the interleaf PF even if the transfer path length of the interleaf PF changes, it is possible to prevent loosening due to extension and excessive tension due to shrinkage of the interleaf PF. Thus, the dancer roller 13a can achieve the stable transfer of the interleaf PF. Subsequently, the operation of the glass film transfer apparatus 1a will be described while referring to FIG. 1. Hereinafter, the description of the preparation operation for operating the glass film transfer apparatus 1a, such as winding the interleaf PF and the glass film GF around each roller by carrying in the glass roll to the glass film transfer apparatus 1a will not be provided.

The glass film GF as one film of the laminated film is wound off from the glass roll R1 of the wind-off section 2, and is transferred to the glass film transfer section 3. Furthermore, after the wind-off section 2 rotates approximately half from the winding-off of the glass film GF, the interleaf PF as the other film of the laminated film is wound off and is transferred to the interleaf transfer section 5a.

The glass film GF transferred to the glass film transfer section 3 is subjected to the surface treatment by performing the sputtering treatment or the like, while being wound around the deposition roller 8 from the first guide roller 9.

The glass film GF subjected to the surface treatment is transferred to the second guide roller 10 from the deposition roller 8, and is transferred to the take-up section 4 from the second guide roller 10.

At the same time as the transfer of the glass film GF, the interleaf PF is transferred to the interleaf transfer section 5a, and is transferred to the take-up section 4 from the first interleaf roller 11 through the second interleaf roller 12. Tension is applied to the interleaf PF by the dancer roller 13a in the course of being transferred to the second interleaf roller 12 from the first interleaf roller 11.

As illustrated in FIG. 1, the interleaf PF passed through the second interleaf roller 12 is wound around the take-up section 4. The take-up section 4 rotates approximately half after winding of the interleaf PF, and then, takes up the glass film GF, which is transferred from the second guide roller 10, on the previously taken-up interleaf PF to form a glass roll R2 again.

In this way, the take-up section 4 does not take up the glass film GF immediately after taking up the interleaf PF, and takes up the glass film GF on the taken-up interleaf PF after rotating to some extent by taking up the interleaf PF. The take-up section 4 performs the take-up of the interleaf PF and the take-up of the glass film GF with a time difference between them. This time difference is achieved by a positional relation between the second guide roller 10 and the second interleaf roller 12 with respect to the take-up section 4. For example, it is possible to change the time difference depending on the characteristics of the glass film GF and the interleaf PF, by changing the positions of the second guide roller 10 and the second interleaf roller 12.

In this embodiment, the second guide roller 10 and the second interleaf roller 12 form a take-up adjusting mechanism. The take-up adjusting mechanism adjusts the take-up state of the interleaf PF and the glass film GF in the take-up section 4. The second interleaf roller 12 is a component that is included in both the interleaf transfer section 5a and the take-up adjusting mechanism.

By means of the glass film transfer apparatus 1a provided with the dancer roller mechanism, even if the interleaf PF made of resin which is wound off from the take-up section 4 shrinks or extends in vacuum, since it is always adjusted to proper transfer path length and the proper tension is applied thereto, the interleaf PF is taken up around the take-up section 4 without causing wrinkles or waviness. If the interleaf PF is taken up without causing wrinkles or waviness, it is possible to prevent the breakage of the glass film GF that is taken up on the interleaf PF. In addition, it is possible to prevent the glass film GF from being damaged by excessive tension applied to the interleaf PF.

Next, a modified example of the dancer roller mechanism will be described while referring to FIG. 2A to 2C-3.

Figures 1, 2B:
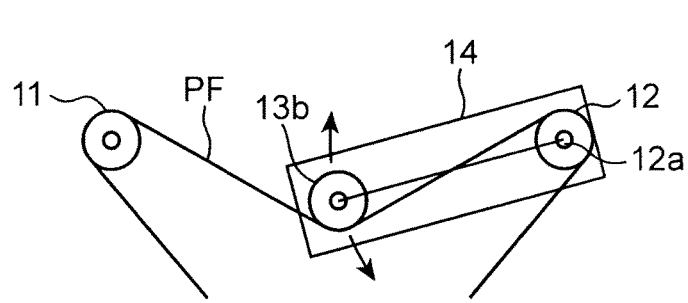
Figures 2, 2B:
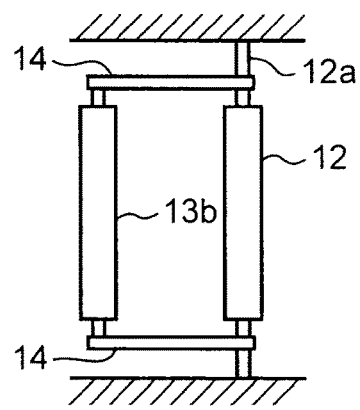

FIGS. 2B-1 and 2B-2 illustrate a dancer roller 13b that rotates around the rotational axis of the second interleaf roller 12. FIG. 2B-1 is a diagram in which the first interleaf roller 11, the second interleaf roller 12, and the dancer roller 13b are viewed from the direction of extension of each of the rotational axes, and FIG. 2B-2 is a diagram illustrating a planar arrangement of the second interleaf roller 12 and the dancer roller 13b. In FIGS. 2B-1 and 2B-2, one end sides of two flat arms 14, which rotate around a rotational axis 12a, are attached to the rotational axis 12a of the second interleaf roller 12 on the both end sides of the second interleaf roller 12. A dancer roller 13b is attached to the other end sides of the two arms 14 so as to be parallel to the rotational axis 12a of the second interleaf roller 12. By the two arms 14, the dancer roller 13b freely rotates around the rotational axis 12a of the second interleaf roller 12, and can apply the tension to the interleaf PF from above, as illustrated in FIGS. 2B-1 and 2B-2. The two arms 14 holding the dancer roller 13b may rotate by the own weight of the dancer roller 13b, and may rotate by an actuator that rotates the two arms 14 independently from the rotational axis 12a of the second interleaf roller 12.

Figures 1, 2C:
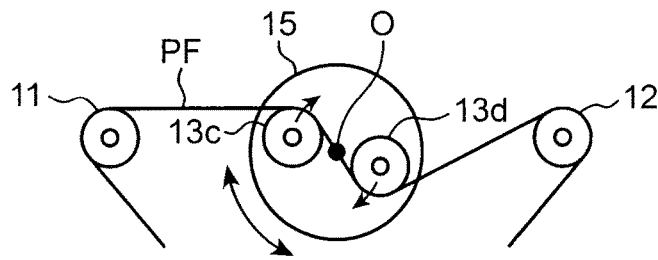
Figures 2, 2C:
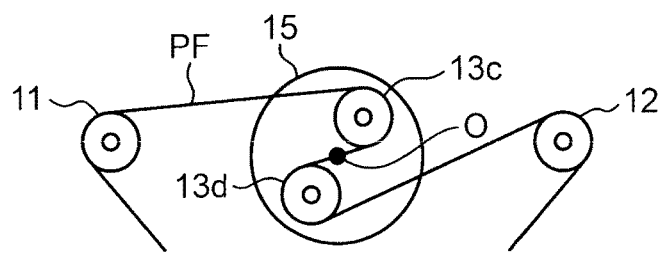
Figures 2, 2C, 3:
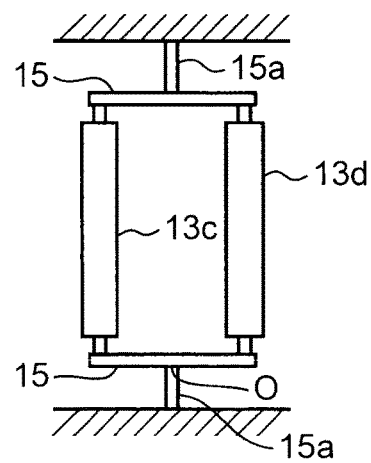
Figure 3:
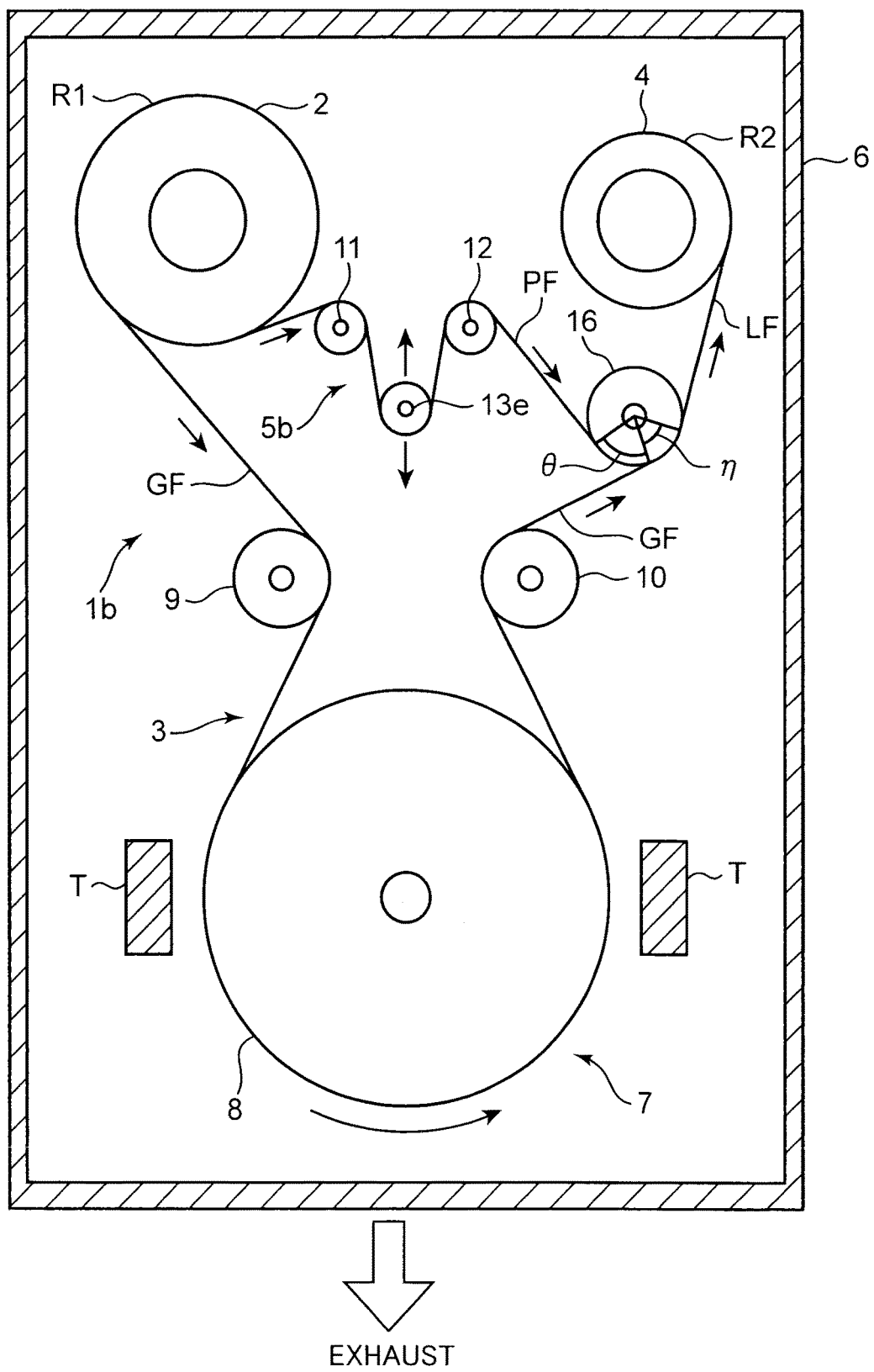

Another modified example of the dancer roller mechanism is illustrated in FIGS. 2C-1 to 2C-3. FIG. 2C-1 is a diagram in which the first interleaf roller 11, the second interleaf roller 12, the first roller 13c, and the second roller 13d are viewed from the direction of extension of the respective rotational axes. FIG. 2C-2 is a diagram illustrating a state in which the first roller 13c and the second roller 13d rotate around the center O in a clockwise direction to absorb the elongation of the interleaf PF. FIG. 2C-3 is a diagram illustrating the planar arrangement of the first roller 13c and the second roller 13d. The dancer roller mechanism illustrated in FIGS. 2C-1 to 2C-3 holds the first roller 13c and the second roller 13d having the same configuration as that of the dancer roller 13b in parallel. In FIGS. 2C-1 to 2C-3, the first roller 13c and the second roller 13d held in parallel are interposed and integrated between two discs 15 from the direction of rotational axis of each of the rollers 13c and 13d, thereby forming a dancer roller mechanism. At this time, it is preferred that the centers O of the two discs 15 correspond to each other, in the direction of rotational axes of the first roller 13c and the second roller 13d held in parallel. Also, it is preferred that the rotational axes of the first roller 13c and the second roller 13d be held on the discs 15 so as to be equidistant from the center O of the disc 15 on a single diameter of each disc 15.

Also, as illustrated in FIGS. 2C-1 to 2C-3, the center O of the two discs 15, that is, the rotational axis 15a of the dancer roller mechanism in which the first roller 13c and the second roller 13d are integrated, is an axis that passes through the centers of the two discs 15, and is disposed substantially at the intermediate position between the first interleaf roller 11 and the second interleaf roller 12 so as to be parallel to the rotational axes of the first interleaf roller 11 and the second interleaf roller 12.

After the interleaf PF is caused to pass between the first roller 13c and the second roller 13d of the dancer roller mechanism, when applying the rotational torque to the dancer roller mechanism in a clockwise direction toward to the plane of FIG. 2C-1, the first roller 13c and the second roller 13d rotationally move in a direction of pressing the interleaf PF, and as illustrated in FIG. 2C-1, it is possible to apply the tension to the interleaf PF.

When, for example, the elongation of the interleaf PF occurs in the process of operation of the glass film transfer apparatus, as illustrated in FIG. 2C-2, the dancer roller mechanism further rotates in the clockwise direction, thereby being able to absorb the elongation of the interleaf PF and to apply the continued appropriate tension. If the shrinkage of the interleaf PF occurs, the path length is adjusted by the opposite operation.

Furthermore, it may be configured to have a function of cleaning the interleaf PF by keeping adhesiveness on at least one surface of the rollers that form the interleaf transferring mechanism 5. For example, in the case of the configuration of FIG. 2A, when the surface of the dancer roller 13a, and one surface of the first interleaf roller 11 or the second interleaf roller 12 have the cleaning function, respectively, it is possible to clean both sides of the interleaf PF. The glass film transfer apparatus 1a according to this embodiment is able to prevent the breakage of the taken-up glass film GF due to foreign matters adhering to the interleaf PF, by removing particles such as dust adhering to the surface of the interleaf PF.

However, in the structure in which the glass film GF and the interleaf PF are taken up around the take-up section 4, if the structure is determined without considering the positional relation between the entry of the glass film GF and the entry of the interleaf PF with respect to the take-up section 4, there may be a problem that causes breakage of the glass film GF, by the causes such as residual waviness of the interleaf PF before taking up the glass film GF.

At the end of this embodiment, the structure around the take-up section 4 for preventing the problems, and specifically, the preferred positional relation of each rollers that constitute the take-up adjustment mechanism will be described.

As described above, the take-up adjusting mechanism, which adjusts the take-up state of the interleaf PF and the glass film GF in the take-up section 4, is formed by the second guide roller 10 and the second interleaf roller 12. In FIG. 1, the take-up section 4 takes up the glass film GF on the taken-up interleaf PF, after rotating to some extent, rather than immediately after taking up the interleaf PF. The take-up section 4 performs the taking-up of the interleaf PF and the taking-up of the glass film GF with, so to speak, an angular difference between them. The angular difference is intended to be achieved by the positional relation between the second guide roller 10 and the second interleaf roller 12 with respect to the take-up section 4. For example, by changing the position of the second guide roller 10 and the second interleaf roller 12, it is possible to change the angle depending on the characteristics of the glass film GF and the interleaf PF.

Description will be made while referring to FIG. 1 again. In the glass film transfer apparatus 1a according to this embodiment, the take-up adjusting mechanism which adjusts the take-up state of the interleaf PF and the glass film GF in the take-up section 4 is constituted by the interleaf roller 12 and the second guide roller 10, and the take-up section 4 takes up the glass film GF from the second guide roller 10, after a lapse of a predetermined angle θ after taking up the interleaf PF that is supplied from the interleaf roller 12. The angle θ is achieved by the relation of the angle of the interleaf PF and the glass film GF supplied to the take-up section 4.

In this embodiment, the take-up adjusting mechanism adjusts the take-up state of the interleaf PF and the glass film GF in the take-up section 4, by keeping the positional relation in which the glass film GF is laminated on the previously taken-up interleaf PF, in the rotation range in which the rotation angle θ of the take-up section 4 after the interleaf PF supplied from the interleaf roller 12 comes into contact with the take-up section 4 is 90° or more and 315° or less (that is, the rotation range of 90° or more and 315° or less from the position at which the interleaf PF begins to be taken up around the take-up section 4).

For example, in FIG. 1, the take-up section 4, the interleaf roller 12 and the second guide roller 10 are disposed so that the interleaf PF supplied from the interleaf roller 12 comes into contact with the left side of the take-up section 4, and the glass film GF from the second guide roller 10 comes into contact with the right side of the take-up section 4. In FIG. 1, the take-up section 4 requires the rotation angle θ of about 180°, from the position at which the interleaf PF comes into contact with the take-up section 4 to the position at which the glass film GF comes into contact with the take-up section 4.

Thus, providing the rotation angle θ from the taking-up of the interleaf PF to the taking-up of the glass film GF is intended to prevent breakage of the glass film GF. That is, since there is a possibility that the waviness of sheet leading to the breakage of the glass film GF remains in the interleaf PF immediately after taken up around the take-up section 4, it is preferred to laminate the glass film GF after the waviness disappears. In order to achieve the stably expanded state that is suitable for lamination of the glass film GF after the interleaf PF comes into contact with the take-up section, it is preferable to empirically pass through the angle of 90° or more.

Meanwhile, when the rotation angle θ from the taking-up of the interleaf PF to the taking-up of the glass film GF is too large, conversely, the interleaf PF comes into contact with the take-up section immediately after taking up the glass film GF. After taking up the glass film GF, when the interleaf PF is wound within 45°, since the interleaf PF is wound before the glass film GF comes into contact with the take-up section in a sufficiently settled state (that is, a sufficiently stable state), this range is undesirable. As a result, it is preferable that the rotation angle from the taking-up of the interleaf PF to the taking-up of the glass film GF be an angle between 90° to 315°. In addition, the rotation angle θ can be changed depending on the characteristics of the interleaf PF and the glass film GF.

Next, the take-up adjusting mechanism equipped with a winding adjustment roller 19 for adjusting the rotation angle θ will be described with reference to FIGS. 5A and 5B.

Figure 5A:
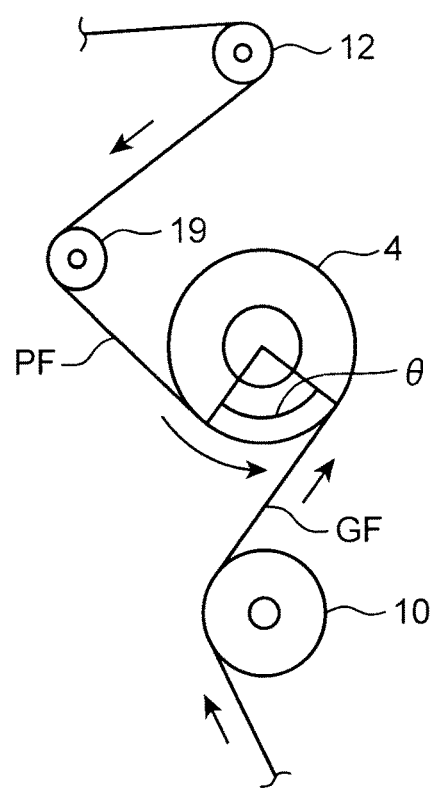
FIGS. 5A and 5B are schematic diagrams illustrating a configuration of the glass film transfer apparatus according to the first embodiment of the present invention. Each FIG. 5A

FIG. 5A illustrates a configuration of the take-up adjusting mechanism in which the winding adjustment roller 19 is disposed between the interleaf roller 12 and the take-up section 4, as a modified example of the first embodiment. The winding adjustment roller 19 has almost the same configuration as that of the interleaf roller 12. The winding adjustment roller 19 supplies the interleaf PF, which is supplied from the interleaf roller 12, to the left lower side of the take-up section 4, after once inducing the interleaf to the left side of the take-up section 4. In comparison with FIG. 1, the contact position of the interleaf PF with the take-up section 4 by the winding adjustment roller 19 moves to the lower side of the take-up section 4, and the rotation angle θ of the take-up section 4 from the contact position of the interleaf PF with the take-up section 4 to the contact position of the glass film GF with the take-up section 4 is approximately 90°.

Figure 5B:
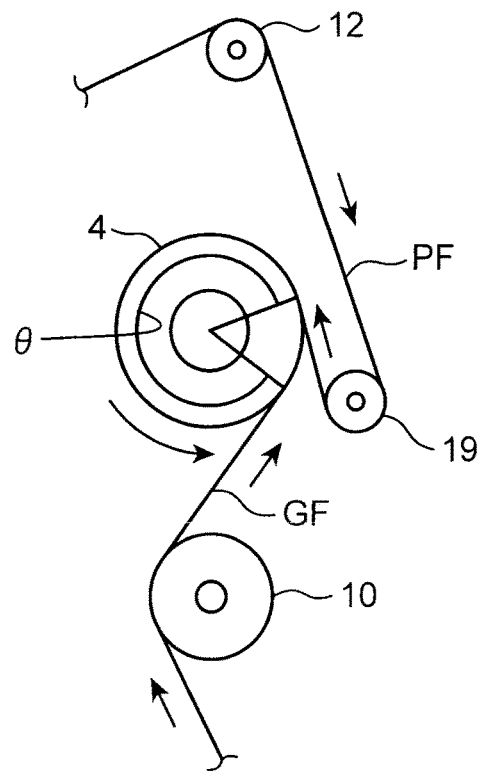

FIG. 5B illustrates the configuration of the take-up adjusting mechanism in which the winding adjustment roller 19 is disposed on the right side of the take-up section 4, as another modified example of the first embodiment. The winding adjustment roller 19 supplies the interleaf PF, which is supplied from the interleaf roller 12, to the right side of the take-up section 4, after once inducing the interleaf to the right side of the take-up section 4. Thus, the contact position of the interleaf PF with the take-up section 4 moves to a completely different position from that of FIG. 5A in which the contact position is on the lower left side of the take-up section 4. In FIG. 5B, the rotation angle θ of the take-up section 4 from the contact position of the interleaf PF with the take-up section 4 to the contact position of the glass film GF with the take-up section 4 is approximately 315°.

As described above, since the winding adjustment roller 19 configured to induce the interleaf PF supplied from the interleaf roller 12 to the position different from the take-up section 4 is provided between the interleaf roller 12 and the take-up section 4, the rotation angle θ can be changed depending on the characteristics of the interleaf PF and the glass film GF.

In addition, the relation of the angle at which the interleaf PF and the glass film GF are supplied to the take-up section 4 is also effective other than the glass film transfer apparatus having the transfer mechanism of the interleaf PF as a target of the present invention. For example, as described in the Japanese Unexamined Patent Publication No. 2012-1405, when the interleaf PF is recovered near the wind-off section 2 or the glass roll which is taken up without using the interleaf PF is attached to the wind-off section 2, the interleaf PF that needs to be transferred to the take-up side is not present. In such a case, the supply section of the interleaf PF is provided near the take-up section 4, as described, for example, in Japanese Unexamined Patent Publication No. 2012-1405. Even in such a case, the interleaf PF supplied from the interleaf supply section may be supplied to satisfy the angular relation. Specifically, the interleaf supply section may be alternatively provided at the position of the interleaf roller 12.

Second Embodiment

A glass film transfer apparatus 1b according to a second embodiment of the present invention will be described with reference to FIG. 3.

FIG. 3 illustrates a schematic configuration of a glass film transfer apparatus 1b according to the second embodiment. The wind-off section 2, the deposition roller 8, the take-up section 4, the first guide roller 9 and the second guide roller 10 in FIG. 3 have the same configurations as those of the components denoted by the same reference numerals in the first embodiment.

In comparison with the first embodiment, in the glass film transfer apparatus 1b according to this embodiment, the configuration and arrangement of an interleaf transfer section 5b including a dancer roller mechanism is different from those of the interleaf transfer section 5a of the first embodiment. Therefore, the configuration and arrangement of the interleaf transfer section 5b including the dancer roller mechanism will be described below.

The interleaf transfer section 5b has a lamination roller 16, in addition to the first interleaf roller 11, the second interleaf roller 12, and the dancer roller 13e. The first interleaf roller 11, the second interleaf roller 12 and the dancer roller 13e of the interleaf transfer section 5b are installed below the wind-off section 2 and the take-up section 4, unlike the first embodiment, but these elements perform the same functions as the first interleaf roller 11, the second interleaf roller 12 and the dancer roller 13a in the first embodiment.

The lamination roller 16 has substantially the same configuration as the second guide roller 10. The lamination roller 16 is provided between the take-up section 4 and the second guide roller 10 so as to be parallel to the take-up section 4 and the second guide roller 10. The interleaf PF transferred by the interleaf transfer section 5b is taken up around the lamination roller 16 from the lower side to change the transfer direction, is laminated onto the glass film GF transferred from the glass film transfer section 3 on the lamination roller 16, and is transferred to the take-up section 4. The take-up section 4 takes up the laminated film LF transferred from the lamination roller 16 to form a glass roll R2.

As illustrated in FIG. 3, the interleaf transfer section 5b has a dancer roller 13e that can move linearly up and down between the first interleaf roller 11 and the second interleaf roller 12, similar to the dancer roller mechanism illustrated in FIG. 2A in the first embodiment. In this embodiment, the dancer roller 13e comes into contact with the interleaf PF along the width direction to apply the tension to the interleaf PF, by moving from the top to the bottom by the actuator.

In the glass film transfer apparatus 1b according to this embodiment, even if the resin interleaf PF which is wound off from the take-up section 4 shrinks or extends in vacuum, it is always adjusted to the proper transfer path length by the dancer roller mechanism, and proper tension is applied thereto. For that reason, the interleaf PF is wound around the lamination roller 16 without causing wrinkles or waviness. By winding the interleaf PF around the lamination roller 16 without causing wrinkles or waviness, it is possible to prevent the breakage of the glass film GF laminated on the interleaf PF.

In this way, the take-up section 4 takes up a laminated film LF on which the interleaf PF and the glass film GF are laminated by the lamination roller 16. The lamination roller 16 performs the take-up of the interleaf PF and the take-up of the glass film GF with the slight time difference. The time difference is achieved by a positional relation of the second guide roller 10 with respect to the lamination roller 16. Accordingly, it is possible to change the time difference depending on the characteristics of the glass film GF and the interleaf PF, by changing the positions of the second guide roller 10 and the lamination roller 16.

Therefore, the second guide roller 10, the second interleaf roller 12 and the lamination roller 16 form a take-up adjusting mechanism that adjusts the take-up state of the interleaf PF and the glass film GF in the take-up section 4. The lamination roller 16 is a component that is included in both the interleaf transfer section 5b and the take-up adjusting mechanism.

However, if the structure, in which the glass film GF and the interleaf PF are laminated on the lamination roller 16, is determined without considering the positional relation between the entry of the glass film GF and the entry of the interleaf PF with respect to the lamination roller 16, a problem that causes the breakage of the glass film GF occurs, due to the causes such as residual waviness of the interleaf PF before taking up the glass film GF.

Therefore, a preferred positional relation of each roller that constitutes the peripheral structure of the lamination roller 16 for preventing the problems, specifically, the winding adjustment mechanism will be described.

As described above, the lamination roller 16, the second guide roller 10, and the second interleaf roller 12 forms the take-up adjusting mechanism that adjusts the take-up state of the interleaf PF and the glass film GF in the take-up section 4. In FIG. 3, the glass film GF is not taken up on the lamination roller 16 immediately after taking up the interleaf PF, and after rotation to some extent by taking up the interleaf PF, the glass film GF is laminated onto the taken-up interleaf PF and wound. On the lamination roller 16, the winding of the interleaf PF and lamination and winding of the glass film GF thereon are performed with an angular difference. The angular difference is achieved by the positional relation of the second guide roller 10, the second interleaf roller 12 and the take-up section 4 with respect to the lamination roller 16. For example, by a change in the position of the second guide roller 10 and the second interleaf roller 12, it is possible to change the angular difference, depending on the characteristics of the glass film GF and the interleaf PF.

The description will be made again while reference to FIG. 3. In the glass film transfer apparatus 1b according to this embodiment, the take-up adjusting mechanism which adjusts the take-up state of the interleaf PF and the glass film GF in the take-up section 4 is constituted by the lamination roller 16, the second interleaf roller 12, and the second guide roller 10. On the lamination roller 16, first, the interleaf PF supplied from the second interleaf roller 12 is wound, and then, after the lamination roller 16 rotates by a predetermined rotation angle θ, the glass film GF from the second guide roller 10 is laminated onto the interleaf PF and wound. Next, the glass film GF is transferred on the lamination roller 16 by a predetermined rotation angle η in a state of being laminated onto the interleaf PF and wound. Thereafter, the laminated film LF obtained by laminating the glass film GF and the interleaf PF is directed to the take-up section 4. The rotation angle θ and the rotation angle η are achieved by the relation between the supply angle of the interleaf PF and the glass film GF to the lamination roller 16, and the angle toward the take-up section 4.

In this embodiment, the take-up adjusting mechanism adjusts the take-up state of the interleaf PF and the glass film GF, by keeping the positional relation in which, after the interleaf PF supplied from the second interleaf roller 12 is wound on the lamination roller 16 by the rotation angle θ (a first rotation angle) of 45° or more, the glass film GF is laminated on the previously taken-up interleaf PF, the rotation angle η (a second rotation angle) at which the laminated state of the interleaf PF and the glass films GF is kept on the lamination roller 16 is in a range of 30° or more and 90° or less (30° to 90°), and the rotation angle (that is, the sum of the first rotation angle and the second rotation angle (rotation angle θ+rotation angle η)) at which the interleaf is wound around the lamination roller 16 is less than 270°.

In this embodiment, the take-up adjusting mechanism is intended to adjust the take-up state of the interleaf PF and the glass film GF, while keeping the positional relation in which the glass film GF is laminated on the interleaf PF in the rotation range in which the interleaf PF supplied from the second interleaf roller 12 has the rotational angle θ of the lamination roller 16 of 45° or more, and preferably, 60° or more.

The inventors of this application have knowledge of the fact that the waviness of the interleaf PF early disappears on the lamination roller 16, as compared to the case of being wound on the glass roll R2 as in the first embodiment, throughout the experiment. Specifically, it has been found that, if the interleaf PF is transferred at the rotation angle of the lamination roller 16 by approximately 45° after the contact with the lamination roller 16, the interleaf PF spreads on the lamination roller 16 without waviness and wrinkles.

In addition to this, if the temperature of the lamination roller 16 is adjusted to be, for example, approximately −20° C. to 80° C., even if the glass film GF heated to a high temperature in the surface treatment process is laminated on the interleaf PF coming into contact with the lamination roller 16, the interleaf PF is not damaged by heat.

In addition, in the take-up adjusting mechanism in this embodiment, after the interleaf PF and the glass film GF are laminated on the lamination roller 16 to become a laminated film LF, the laminated film LF is transferred on the lamination roller 16, while keeping the contact with the lamination roller 16 by a predetermined rotation angle η of the lamination roller 16 (the rotation range in which the rotation angle η is 30° or more and 90° or less), and thereafter, the laminated film is detached from the lamination roller 16 and is supplied to the take-up section 4. If the rotation angle η is less than 30°, the laminated film gets away from the lamination roller before the lamination of the glass film GF and the interleaf PF is stabilized, and thus, the laminated film LF is not stable. Meanwhile, when laminated at an angle of 90° or more, there is a high possibility that the glass film GF is empirically damaged. Therefore, if the rotation angle η is set to a rotation range of 30° or more and 90° or less, since the lamination of the glass film GF and the interleaf PF is stabilized, and the possibility of breakage of the glass film GF is low, this range is preferable.

Here, the take-up adjusting mechanism is preferably configured so that the sum of the two rotation angles, that is, the sum (θ+η) of the rotation angle θ of the lamination roller 16 to the lamination of the glass film GF on the interleaf PF after the contact of the interleaf PF with the lamination roller 16, and the rotation angle η in which the laminated film LF keeps contact with the lamination roller 16 on the lamination roller 16 is 270° or less. This is because if the rotation angle exceeds 270°, unreasonableness occurs in the mechanical structure.

In addition, as the laminated film LF is taken up, the diameter of the glass roll of the take-up section 4 increases. Even when there is such a variation, the arrangement of each mechanism should be taken into account so that the relation of the angle is satisfied.

In this way, the glass film transfer apparatus 1b according to this embodiment is characterized by having a take-up adjusting mechanism of a configuration in which the rotation angle θ from the take-up of the interleaf PF on the lamination roller 16 to the take-up of the glass film GF is provided, and the rotation angle η is provided after obtaining the laminated film LF on the lamination roller 16 to supply the laminated film LF to the take-up section 4.

Such a configuration of the take-up adjusting mechanism is intended to prevent breakage of the glass film GF. Since there is a possibility that the waviness which causes breakage of the glass film GF is present on the interleaf PF immediately after taken up around the lamination roller 16, it is preferable to laminate the glass film GF after the waviness disappears. In addition, it is preferred that the laminated film LF be taken up after the interleaf PF and the glass film GF are sufficiently familiar with each other. In this embodiment, first, the rotation angle θ of the lamination roller 16 required for disappearance of waviness of the taken-up interleaf PF is secured, and the time difference required for making the laminated interleaf PF and the glass film GF familiar with each other (for example, fix) is secured as the rotation angle η of the lamination roller 16. In addition, the rotation angle θ and the rotation angle η can be changed depending on the characteristics of the interleaf PF and the glass film GF.

Next, the take-up adjusting mechanism provided with the winding adjustment roller 20 for adjusting the rotation angle θ required for disappearance of the waviness of the taken-up interleaf PF between the two angles will be described referring to FIG. 6.

Figure 6:
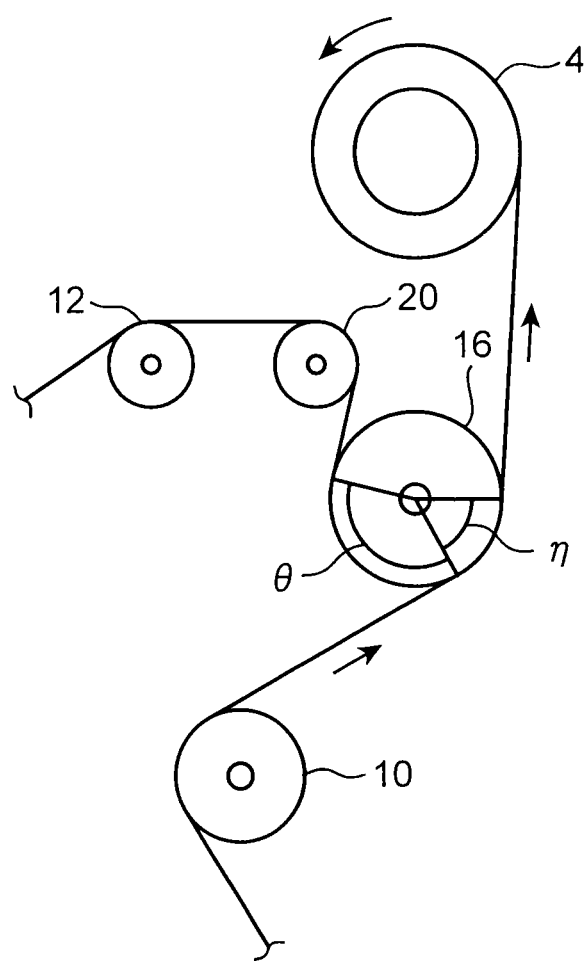
FIG. 6 is a schematic diagram illustrating a modified example of a take-up adjusting mechanism of the glass film transfer apparatus according to the second embodiment of the present invention.

FIG. 6 illustrates a configuration of a take-up adjusting mechanism in this embodiment. In FIG. 6, the winding adjustment roller 20 having substantially the same configuration as that of the second interleaf roller 12 is disposed on the right side of the interleaf roller 12 and slightly above the lamination roller 16. The winding adjustment roller 20 supplies the interleaf PF supplied from the second interleaf roller 12 to the left side of the lamination roller 16, once after induction to the upper part of the lamination roller 16.

In comparison with FIG. 3, by the winding adjustment roller 20, the contact position of the interleaf PF with the lamination roller 16 changes to the left upper part of the lamination roller 16, and the rotation angle θ from the contact position of the interleaf PF with the lamination roller 16 to the contact position of the glass film GF changes from about 90° to about 135°. The winding adjustment roller 20 achieves a running length in which the waviness of the taken-up interleaf PF completely disappears, by changing the rotation angle θ.

As described above, it is possible to change the rotation angle θ depending on the characteristics of the interleaf PF and the glass film GF, by providing the winding adjustment roller 20, which induces the interleaf PF supplied from the interleaf roller 12 to a position different from the lamination roller 16 once, between the second interleaf roller 12 and the lamination roller 16.

Alternatively, it is also possible to change the position of the second interleaf roller 12 instead of the winding adjustment roller 20.

In addition, the relation of the angle, in which the interleaf PF and the glass film GF are supplied to the lamination roller 16 and are supplied to the take-up section 4, is also effective other than the glass film transfer apparatus having the transfer mechanism of the interleaf PF as the target of the present invention. For example, as described in Japanese Unexamined Patent Publication No. 2012-1405, when the interleaf PF is recovered near the wind-off section 2 or when the glass roll which is taken up without using the interleaf PF is attached to the wind-off section 2, the interleaf PF to be transferred to the winding is not present. In such a case, a supply section of the interleaf PF may be separately provided near the take-up section 4. Even in this case, the interleaf PF supplied from the interleaf supply section is supplied so as to satisfy the angular relation. Specifically, it is preferred to provide an interleaf supply section at the position of the second interleaf roller 12.

Third Embodiment

Figure 4:
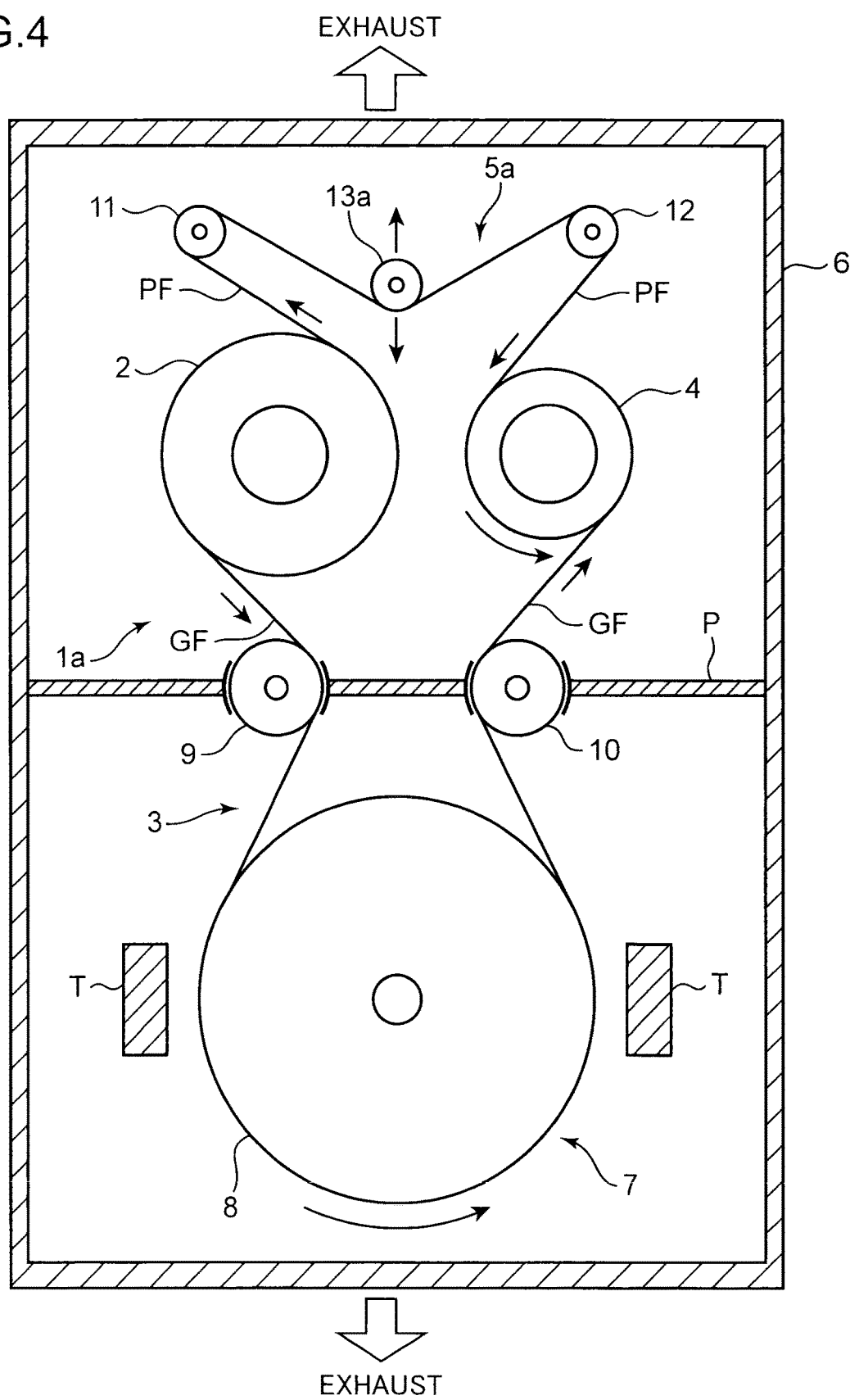
FIG. 4 is a diagram illustrating a schematic configuration of a state in which a glass film transfer apparatus is stored in a vacuum chamber according to a third embodiment of the present invention.

A third embodiment of the present invention will be described referring to FIG. 4. FIG. 4 illustrates a schematic configuration in a state in which the glass film transfer apparatus 1a described in the first embodiment is stored in the vacuum chamber 6 having a chamber partition P. The third embodiment illustrated in FIG. 4 is different from the first embodiment in that the vacuum chamber 6 has the chamber partition P.

The vacuum chamber 6 illustrated in FIG. 4 has the chamber partition P approximately at the center in the vertical direction at the position where the first guide roller 9 and the second guide roller 10 are disposed.

The chamber partition P is formed from the left side wall to the right side wall of the vacuum chamber 6, and partitions the upper region and the lower region of the vacuum chamber 6 so as not to interfere with the first guide roller 9 and the second guide roller 10. The upper region of the vacuum chamber 6 is evacuated by the vacuum pump provided on the upper side, and the lower region of the vacuum chamber 6 is evacuated by a vacuum pump provided on the lower side.

It is possible to isolate the sputter deposition section 7 for performing the surface treatment process from the interleaf transfer section 5a by the chamber partition P, and it is possible to prevent dust, such as flakes (thin pieces) of the peeled film generated by the deposition, from sticking to the interleaf PF of the interleaf transfer section 5a. For that reason, it is possible to avoid a situation in which the glass film GF laminated on the interleaf PF is damaged due to dust adhering to the interleaf PF.

In addition, outgas components such as the water vapor and organic substances are released from the interleaf along with the evacuation, but by providing the chamber partition P, it is possible to suppress the movement of the outgas components to the vicinity of the sputter deposition section 7. For that reason, it is possible to minimize the effects of outgas components on the treatment such as deposition.

In addition, the invention having the following configurations are mainly included in the specific embodiments.

The glass film transfer apparatus of the present invention is a glass film transfer apparatus configured to continuously transfer a long glass film, which includes a wind-off section that winds off the glass film from a roll around which the glass film having a long interleaf laminated on the glass film is wound; a glass film transfer section that transfers the glass film which is wound off from the wind-off section and is separated from the interleaf; a take-up section that takes up the glass film transferred by the glass film transfer section in the form of roll, while laminating the interleaf on the glass film; an interleaf transfer section that carries out the interleaf separated from the glass film which is wound off from the wind-off section, and carries in the interleaf toward the take-up section; and a take-up adjusting mechanism that adjusts a take-up state of the interleaf and the glass film in the take-up section.

Here, preferably, the interleaf transfer section may have a dancer roller mechanism that comes into contact with the interleaf being transferred by the interleaf transfer section along a width direction of the interleaf to thereby apply tension to the interleaf, and that adjusts a path length of a transfer path of the interleaf in the interleaf transfer section.

More preferably, the dancer roller mechanism has a first roller and a second roller that come into contact with the interleaf in a state where the first and second rollers are parallel to each other to thereby apply tension to the interleaf, the first roller being disposed at a position in which the first roller can come into contact with one side of the interleaf, and the second roller being disposed at a position in which the second roller can come into contact with the other side of the interleaf, and the first roller and the second roller are movable in a direction of coming into contact with the interleaf.

Furthermore, preferably, the interleaf transfer section may include at least one roller having a contact surface that comes into contact with the interleaf, and the contact surface may have viscosity.

In addition, preferably, the take-up adjusting mechanism may adjust the take-up state of the interleaf and the glass film, while keeping a positional relation in which the glass film is laminated on the interleaf in such a rotation range that a rotation angle after contact of the interleaf with the take-up section is 90° or more and 315° or less.

Furthermore, preferably, the take-up adjusting mechanism may include a lamination roller that laminates the glass film transferred by the glass film transfer section on the interleaf transferred by the interleaf transfer section, then, the glass film is laminated on the interleaf in a rotation range in which a first rotation angle of the lamination roller after contact of the interleaf with the lamination roller is 45° or more, and the interleaf having the glass film laminated thereon keeps contact with the lamination roller and is detached from the lamination roller after being transferred in a rotation range in which a second rotation angle of the lamination roller after the lamination is 30° or more and 90° or less, the sum of the first rotation angle and the second rotation angle being preferably 270° or less.

In addition, in the glass film transfer apparatus, the glass sheet transfer section and the interleaf transfer section may be separately stored in two regions independent from each other, and each of the two regions may be independently exhausted.

The invention claimed is:

1. A glass film transfer apparatus that continuously transfers a long glass film, comprising:
    a roll-containing wind-off section that winds off the glass film from a supply roll around which the glass film having a long interleaf laminated on the glass film is wound;

a roller-containing glass film transfer section that transfers the glass film which is wound off from the wind-off section and is separated from the interleaf;

a roll-containing take-up section having a take-up roll that takes up the glass film transferred by the glass film transfer section, while laminating the interleaf on the glass film;

a roller-containing interleaf transfer section that carries out the interleaf separated from the glass film which is wound off from the wind-off section, and carries in the interleaf toward the take-up roll in the take-up section; and a roller position of one or more rollers carrying the interleaf or the glass film is changeable such that take-up positions of the interleaf and the glass film on the take-up roll are at different angular positions on the take-up roll, wherein the take-up roller in the take-up section comprises a lamination roller that laminates the glass film transferred by the glass transfer section on the interleaf transferred by the interleaf transfer section, and the glass film is laminated on the interleaf in a rotation range in which a first rotation angle of the lamination roller after contact of the interleaf with the lamination roller is 45° or more, and the interleaf having the glass film laminated thereon keeps contact with the lamination roller and is detached from the lamination roller after being transferred in a rotation range in which a second rotation angle of the lamination roller after the lamination is 30° or more and 90° or less, the sum of the first rotation angle and the second rotation angle being 270° or less.

2. The glass film transfer apparatus according to claim 1, wherein the interleaf transfer section has a dancer roller mechanism that comes into contact with the interleaf being transferred by the interleaf transfer section along a width direction of the interleaf to thereby apply tension to the interleaf, and that adjusts a path length of a transfer path of the interleaf in the interleaf transfer section.

3. The glass film transfer apparatus according to claim 2, wherein the dancer roller mechanism has a first roller and a second roller that come into contact with the interleaf in a state where the first and second rollers are parallel to each other to thereby apply tension to the interleaf, the first roller being disposed at a position in which the first roller can come into contact with one side of the interleaf, and the second roller being disposed at a position in which the second roller can come into contact with the other side of the interleaf, and the first roller and the second roller are movable in a direction of coming into contact with the interleaf.

4. The glass film transfer apparatus according to claim 2, wherein the interleaf transfer section includes at least one roller having a contact surface that comes into contact with the interleaf, and the contact surface has viscosity.

5. The glass film transfer apparatus according to claim 1, wherein:

the roller-containing glass film transfer section and the roller-containing interleaf transfer section are separately stored in two regions independent from each other, and each of the two regions is independently exhausted.

6. The glass film transfer apparatus according to claim 5, further comprising a partition wall dividing the glass film transfer apparatus.

* * * * *